United States Patent [19]

Fujioka

[11] Patent Number: 5,497,983

[45] Date of Patent: Mar. 12, 1996

[54] WORK POSITIONER OF CHIP MOUNTER FOR MONITORING A CHIP-SHAPED ELECTRONIC PART ONTO A SUBSTRATE

[75] Inventor: Teruhiko Fujioka, Tokyo, Japan

[73] Assignee: Tenryu Technics Co., Ltd., Shizuoka, Japan

[21] Appl. No.: 62,501

[22] Filed: Dec. 28, 1992

Related U.S. Application Data

[63] Continuation-in-part of Ser. No. 845,700, Mar. 4, 1992, abandoned, which is a continuation of Ser. No. 633,476, Dec. 21, 1990, abandoned, which is a continuation-in-part of Ser. No. 257,229, Oct. 13, 1988, abandoned.

[30] Foreign Application Priority Data

Oct. 16, 1987 [JP] Japan .............................. 62-158360 U

[51] Int. Cl.$^6$ ....................................................... H05K 3/30
[52] U.S. Cl. .......................... 269/155; 269/152; 269/237; 29/740; 294/2
[58] Field of Search .................................... 269/152, 153, 269/155, 237, 238, 239, 254 R, 256, 287, 903; 29/740, 743, 2; 294/64.1

[56] References Cited

U.S. PATENT DOCUMENTS

| | | | |
|---|---|---|---|
| 4,515,507 | 5/1985 | Asai et al. | 29/740 |
| 4,753,004 | 6/1988 | Fujoka | 29/740 |
| 4,797,996 | 1/1989 | Lobry et al. | 29/740 |
| 4,964,208 | 10/1990 | Fujioka | 29/740 |
| 4,987,676 | 1/1991 | Amorosi | 29/740 |

Primary Examiner—Bruce M. Kisliuk
Assistant Examiner—Eileen Morgan
Attorney, Agent, or Firm—Rodman & Rodman

[57] ABSTRACT

A work positioner of a chip mounter comprising a positioner mechanism section for positioning a work such as a chip-shaped electronic part and a positioner driving section for driving the positioner mechanism section. The positioner mechanism section includes: guide plate; positioner blocks reciprocatively moving along at least one pair of guide grooves formed in a straight line and opposed to each other on the guide plate; and two pairs of positioner tips connected to the respective positioner blocks while clamping the guide plate in cooperation with the positioner blocks and adapted to open or close in operational association with the reciprocatory motions of the positioner blocks so as to clamp the chip-shaped work therebetween or to release it. The guide plate is clamped between the positioner blocks and the positioner tips, so that the positioner blocks and the positioner tips are caused to move along the guide grooves.

3 Claims, 17 Drawing Sheets

WORK POSITIONER OF CHIP MOUNTER FOR MONITORING A CHIP-SHAPED ELECTRONIC PART ONTO A SUBSTRATE

This is a continuation-in-part of Application Ser. No. 845,700 filed Mar. 4, 1992, now abandoned, which was a continuation of Application Ser. No. 633,476 filed Dec. 21, 1990, and now abandoned, which was a continuation-in-part of Application Ser. No. 257,229 filed Oct. 13, 1988 and now abandoned.

BACKGROUND OF THE INVENTION

1. Field of the Invention

The present invention relates to a work positioner of a chip mounter, and more particularly to techniques effective for application to a work positioner of a mounting head of a chip mounter for mounting a chip-shaped electronic part onto a substrate.

2. Related Art Statement

As a work positioner of this type, there is one constructed such that a work sucker head capable of vacuum-sucking: a work such as a chip-shaped electronic part of a semiconductor integrated circuit (IC) for example, i.e. a bit is vertically movably provided, and the work positioner is vertically movable between two positions provided in the vicinity of the bit, including one position where the work is clamped and the other position where the work is released.

In this work positioner, two pairs of positioner tips horizontally and reciprocatively movable in two directions perpendicular to each other move in states being equalized to the center of the bit, so that the work is positioned at the center of the bit.

However, the above-described work positioner suffers from the problem that the accuracy of positioning the work by the positioner tips is lowered due to shifts in angle and position, etc. Because of this, it is difficult to assemble the work positioner and it takes a long time for adjusting in the assembling work. Moreover, the above-described work positioner suffers from the problems that the number of parts is large, the construction is complicated, the working is difficult to perform, the costs are high and the maintenance properties are low.

Furthermore, for example, since the chip-shaped electronic parts include various types, it is necessary to exchange the positioner tips in accordance with the types. For the small-sized positioner tips, there is aced of exchanging them individually, such problems are presented that four times of working are needed for exchanging four positioner tips individually, the working is difficult to perform. Further, it is disadvantageous to switch over to an automatic exchange process and so forth.

SUMMARY OF THE INVENTION

It is an object of the present invention to provide a work positioner capable of positioning a work with high accuracy.

It is another object of the present Invention to provide a work positioner capable of easily exchanging a positioner mechanism section from a positioner driving section and capable of switching over to an automatic exchange process.

In the work positioner of a chip mounter according to the present invention, a guide plate having guide grooves is clamped between positioner blocks and positioner tips to move along the guide grooves.

By the above-described means, the positioner blocks and the positioner tips are caused to move along the guide grooves of the guide plate, so that positioning of the work by the positioner tips can be effected with high accuracy.

DETAILED DESCRIPTION OF THE INVENTION CONSTRUCTION OF THE EMBODIMENT

The work positioner of the chip mounter in this embodiment is broadly divided into two sections including a positioner mechanism section A for positioning a work such as a chip-shaped electronic part and a position cooperating section B for cooperating with the positioner mechanism section A.

Figure 5:
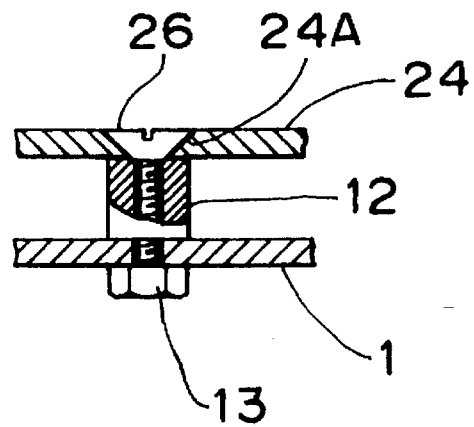
FIG. 5 is a partial sectional view of a guide plate portion.

The positioner mechanism section A has a circular guide plate 1, in which two pairs of guide grooves 2, 2 are formed through the guide plate in the thickness wise direction, i.e. the vertical direction, each pair of grooves extending in a straight line in the radial directions of the guide plate 1 and the pairs being perpendicular to each other. Positioner blocks 3, 3 are inserted at their ridges provided on the undersurface thereof into the respective guide grooves 2, 2 from above. The positioner blocks 3, 3 cooperate with positioner tips 4, 4 provided under the guide plate 1 to sandwich the guide plate 1 from upper and under sides of the guide plate 1, and the positioner blocks 3, 3 and the positioner tips 4, 4 are detachably connected to each other by means of set screws 5, 5 from under side of the positioner tips 4, 4 as shown in FIG. 5.

In the respective pairs of the positioner tips 4, 4, one pair are of generally I-shapes and the other pair are of generally T-shapes, and their inner ends cooperate with each other to perform positioning of the work between these inner ends of the positioner tips 4, 4 in the closed state.

Further, in the guide plate 1, there are formed two oppositely disposed hole 8, with a respective clamp block 6 being inserted in each hole 8 and tightened by respective nuts 7, two oppositely disposed holes 11, with a respective guide block 9 being inserted into each hole 11 and tightened by respective nuts 10, four holes 14, with a respective clamper 12 being inserted into each hole 14 and tightened by respective nuts 13, and further, a center hole 16, through which a vacuum sucker head, i.e. a bit 15 (Refer to FIGS. 2B and 3B) is inserted.

A clamp spring 17 is mounted on each clamp block 6, and a biasing spring 18 is mounted on one of the guide blocks 9.

Furthermore, two pairs or levers, i.e. one pair of levers 19, 19 are pivoted to each other at one of the guide blocks 9 whereas the other pair of levers 20, 20 are pivoted to each other at the other guide block 9. One of the levers 19, 19 and one of the levers 20, 20 are interlockingly connected to each other by one of the slide bars 21 and the other of the levers 19, 19 and 20, 20 are interlockingly connected to each other by the other slide bar 21. See, for example, FIGS. 2A, 3A, 8 and 9.

One end of each slide bar 21 is pivoted to a respective lever 19, 19 via respective pins 21B, 21B. An opposite end of each slide bar 21 is pivoted to a respective lever 20, 20 via respective pins 21B, 21B.

One of the I-shaped positioner tips 4, 4 is connected to one of the levers 19, 19 and the other of the I-shaped positioner tips 4, 4 is connected to one of the levers 20, 20 by the set screw 5. In similar fashion one of the T-shaped positioner tips 4, 4 is connected to the other of the levers 19, 19 and the other of the T-shaped positioner tips 4 is connected to the other of the levers 20.20 by the set screws 5.

Rollers 22, 23 project upward from the respective slide bars 21, 21 being mounted on respective pins 21A, 21A that are fitted in the slide bars 21, 21. These rollers 22, 23 extend through slots 25, 25 of a guide plate 24 and project upward.

This guide plate 24 is connected to the upper ends of the clampers 12 by means of screws 26 which is inserted into the upper ends of the clampers 12 from the upper side of the guide plate 24 as shown in FIG. 5. Therefore, the guide plate 24 serves as a cover for the guide plate 1, via a space defined by the length of the clampers 12, because the lower ends of the clampers 12 are connected to the guide plate 1.

The positioner cooperating section B in this embodiment will hereunder be described. This positioner driving section B is arranged to be detachably connected to the positioner mechanism section A easily in a single operation by means of the clamp block 6, the clamp spring 17, a clamp pin 27 and a nut 28 etc, as described below.

Figure 6A:
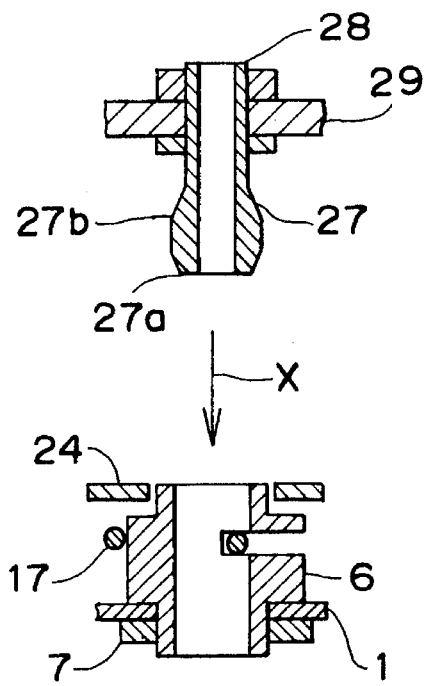
FIG. 6A is a partial sectional view when a clamp pin is detached from a clamp block.
Figure 6B:
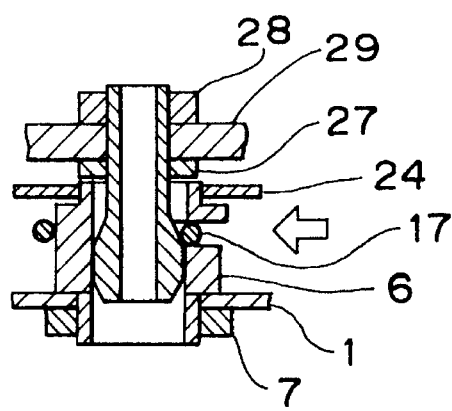
FIG. 6B is a partial sectional view when the clamp pin is pushed into and connected to the clamp block.

Namely, the clamp pin 27 is connected to the guide plate 29 of the positioner driving section B by the nut 28 as shown in FIGS. 6A and 6B. And the clamp section block 6 is also connected to the guide plate 1 of the positioner mechanism A by the nut 7 as shown in FIGS. 6A and 6B. Therefore, the sections A and B are connected detachably by an interlocking between the clamp pin 7 and the clamp block 6 which has the clamp spring 17.

Figure 7A:
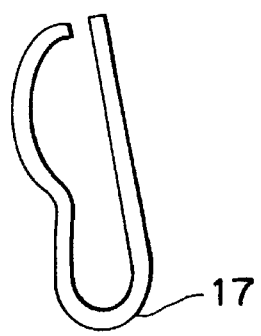
FIG. 7A shows a free state of a clamp spring which corresponds to FIG. 6A.
Figure 7B:
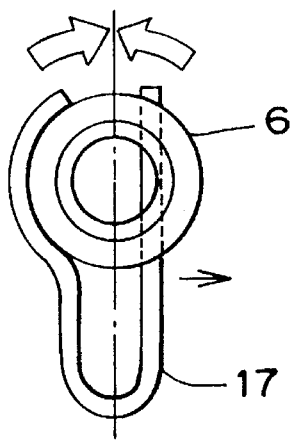
FIG. 7B shows an opened state of the clamp spring which corresponds to FIG. 7B.
Figure 8:
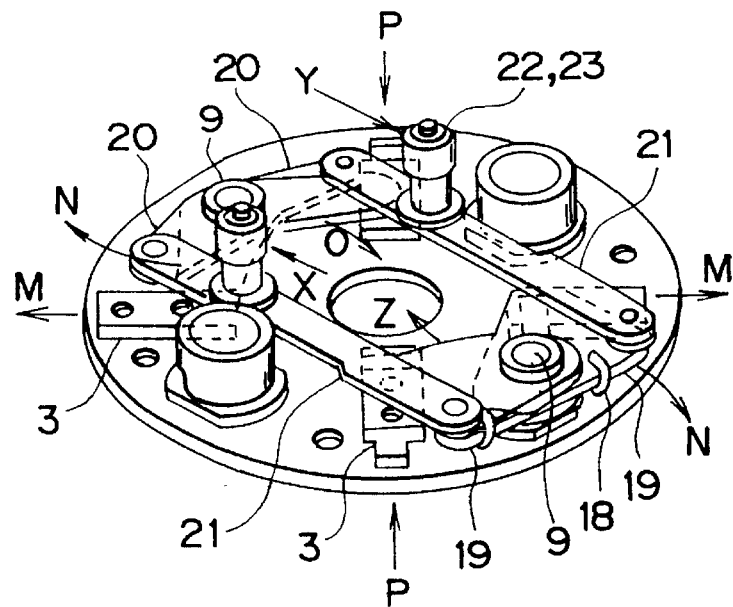
FIG. 8 is a perspective view of the essential portion of the positioner mechanism section.
Figure 9:
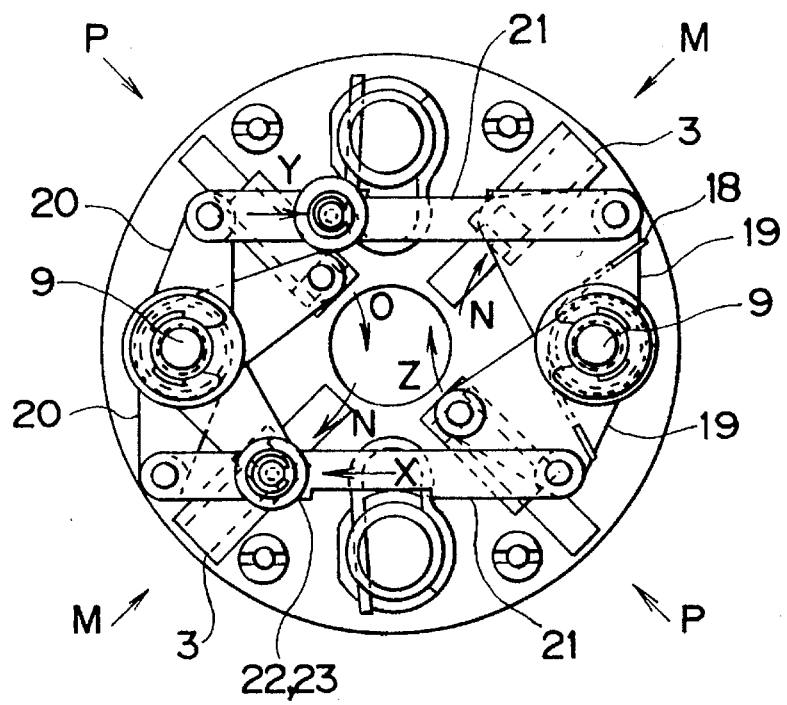
FIG. 9 is a schematic plan view of the portion shown in FIG. 8.
Figure 10:
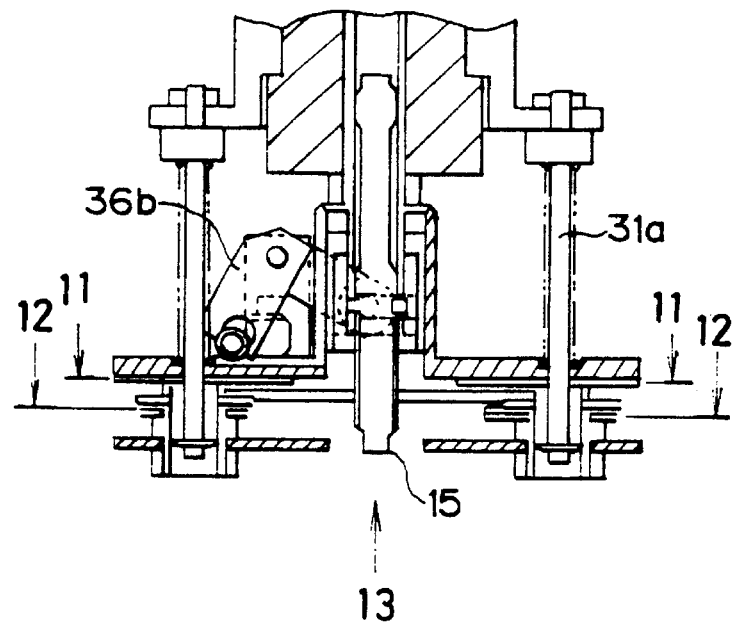
FIG. 10 is a schematic sectional view of the work positioner in the closed state.
Figure 11:
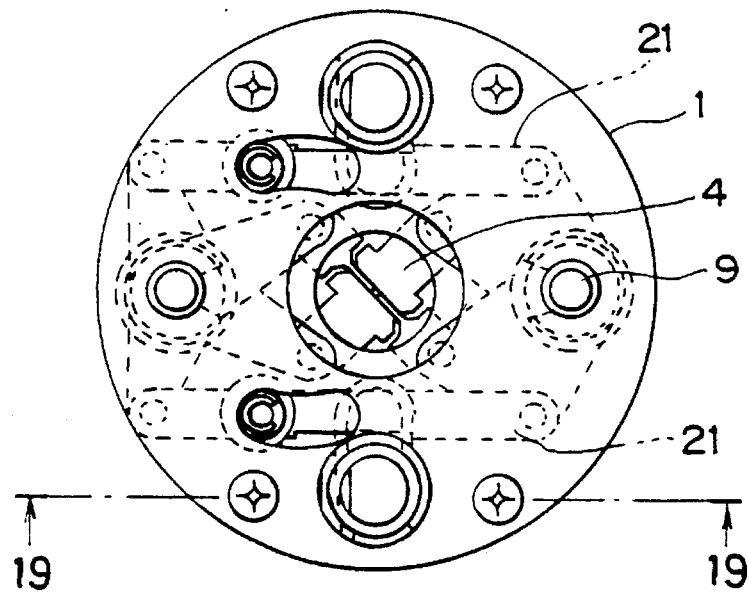
FIG. 11 is a view taken in the direction N in FIG. 10.
Figure 12:
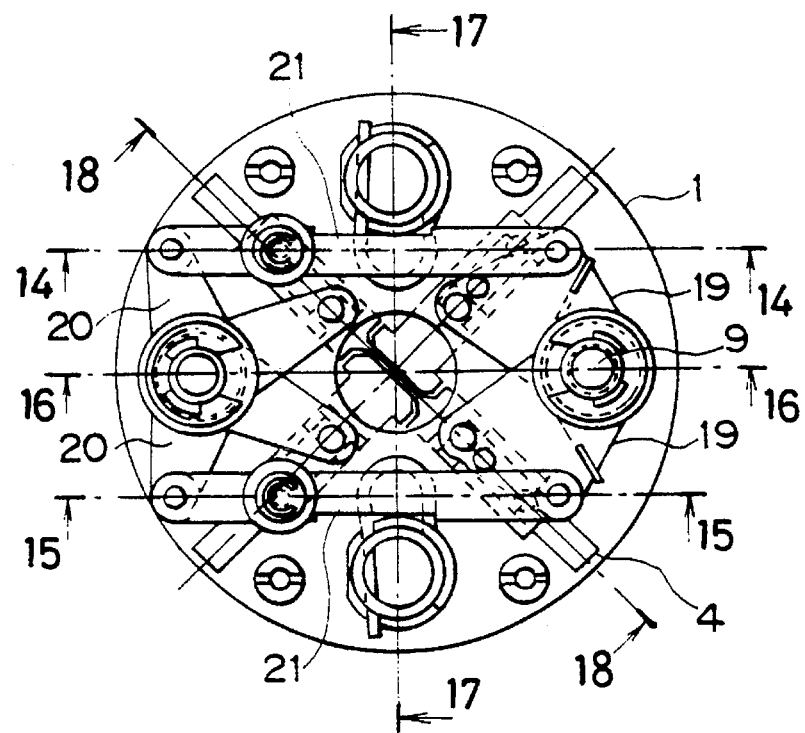
FIG. 12 is a sectional view taken along line O—O in FIG. 10.
Figure 13:
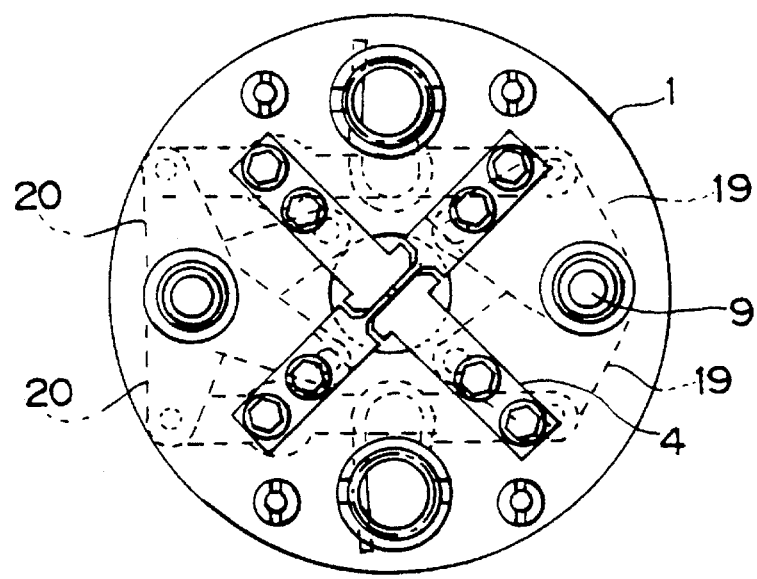
FIG. 13 is a view taken in the direction P in FIG. 10.
Figure 14:
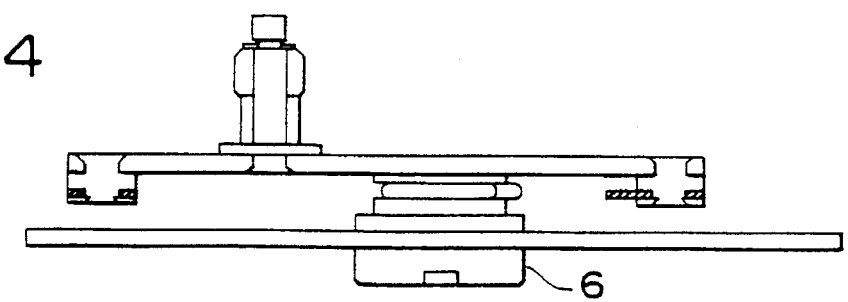
FIGS. 14–18 are sectional views taken along lines H—H, I—I, J—J, K—K, and L—L in FIG. 12 respectively.
Figure 15:
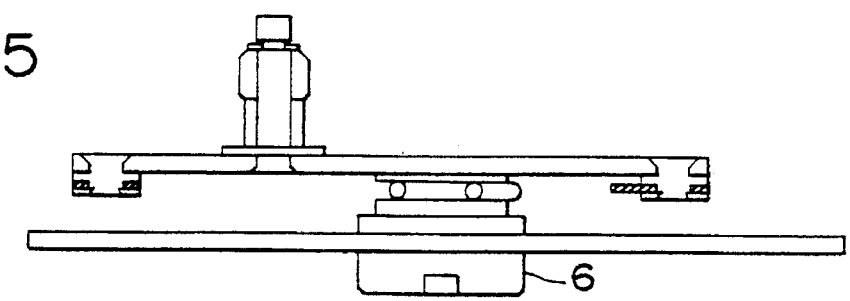
Figure 16:
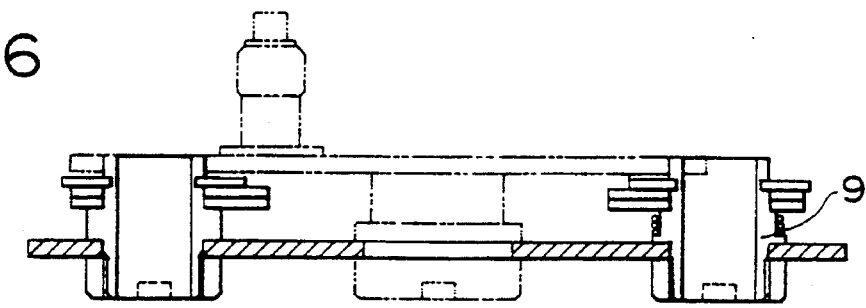
Figure 17:
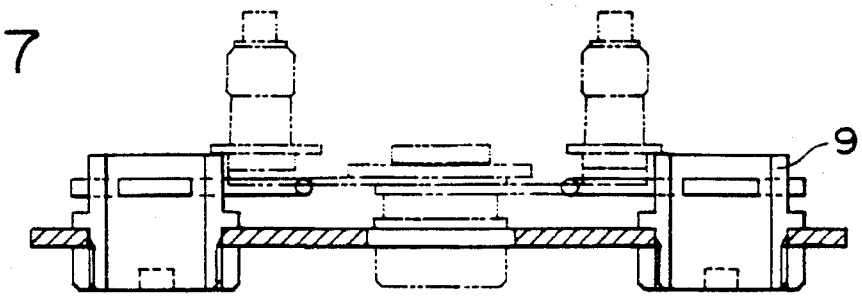
Figure 18:
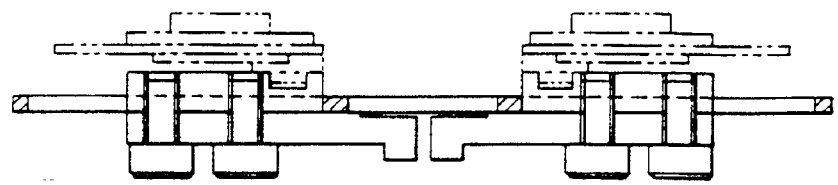
Figure 19:
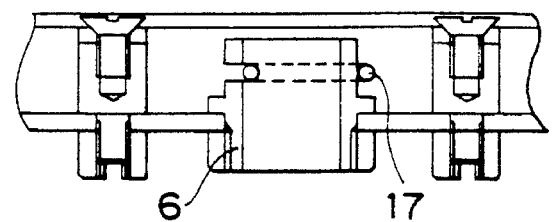
FIG. 19 is a sectional view taken along the line M—M in FIG. 11.
Figure 20:
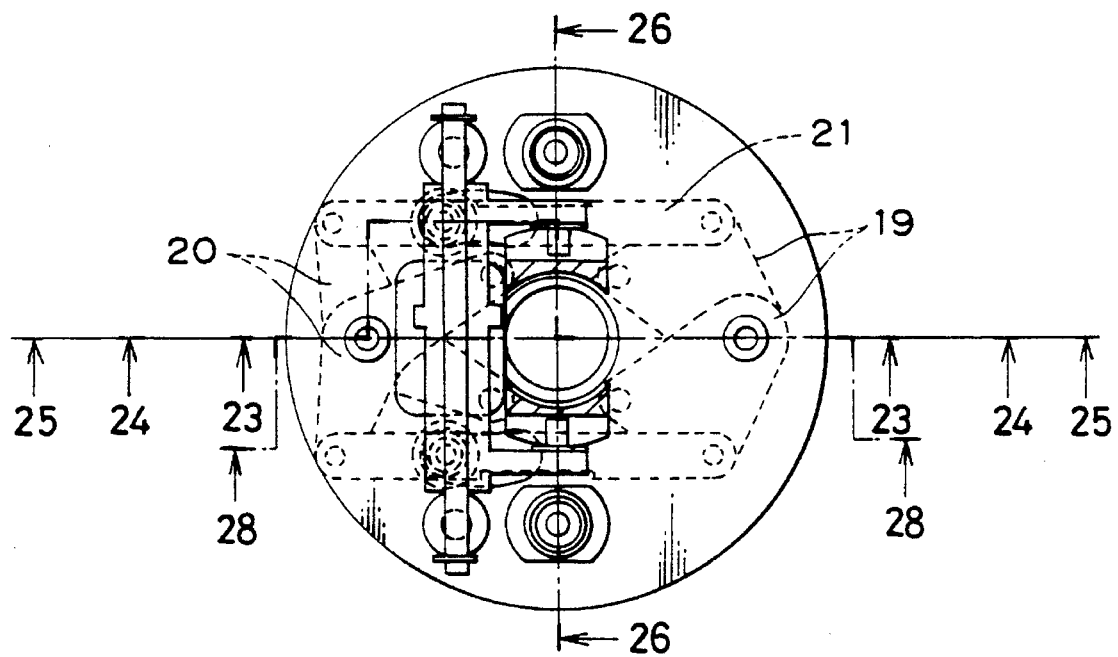
FIG. 20 is a sectional view taken along the line R—R in FIG. 23.
Figure 21:
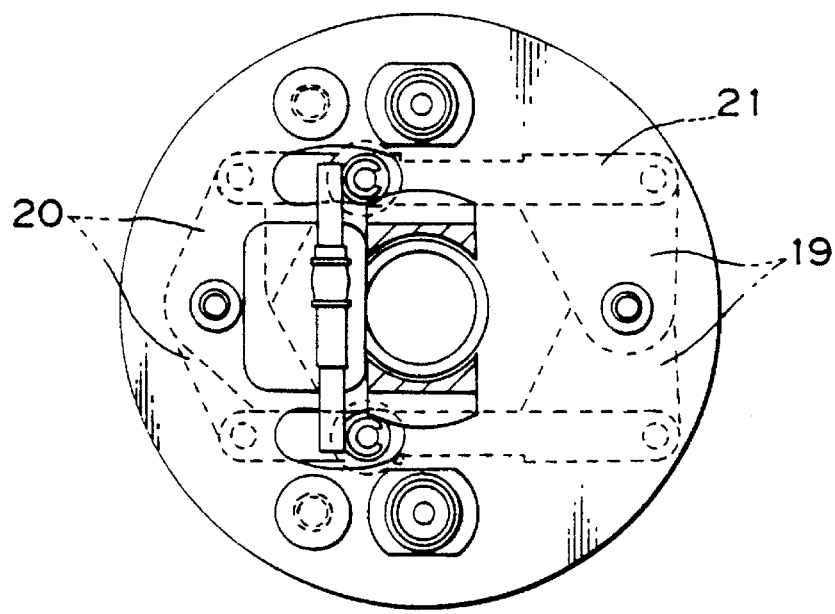
FIGS. 21 and 22 are sectional views taken along the line Q—Q in FIG. 23 wherein the positioner tips are opened or closed respectively.
Figure 22:
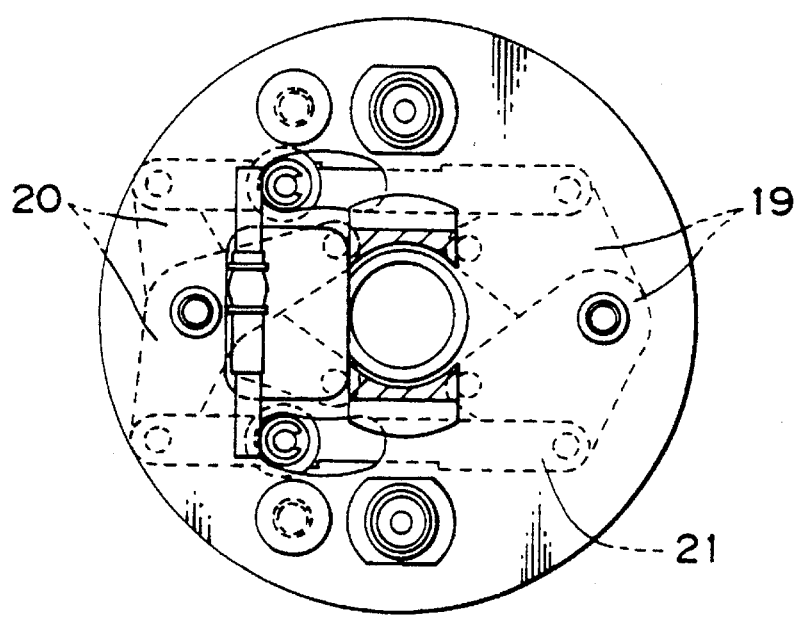
Figure 23:
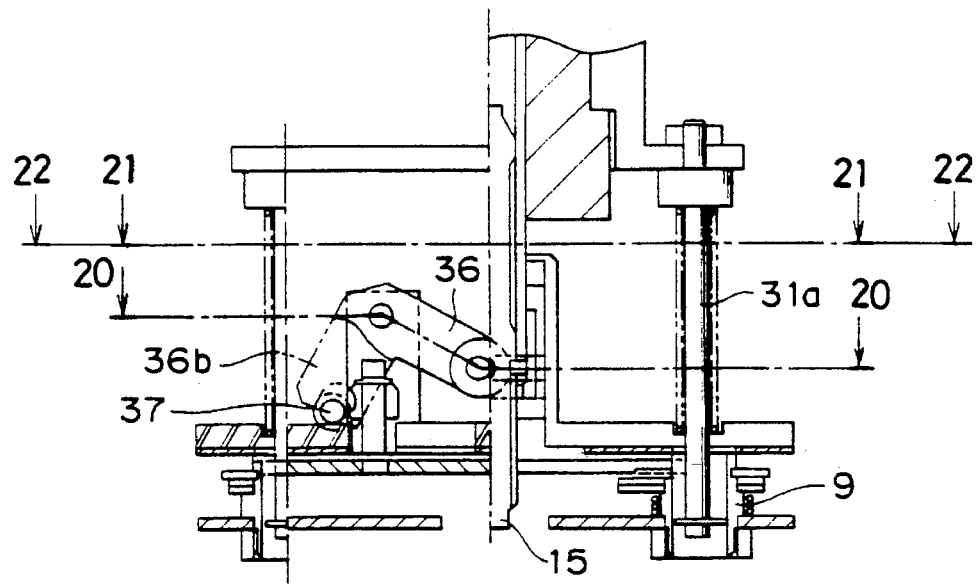
FIGS. 23, 24 and 25 are sectional views taken along line P—P in FIG. 20 wherein the positioner tips are in the normal position, at the time of starting to move upward and downward respectively.
Figure 24:
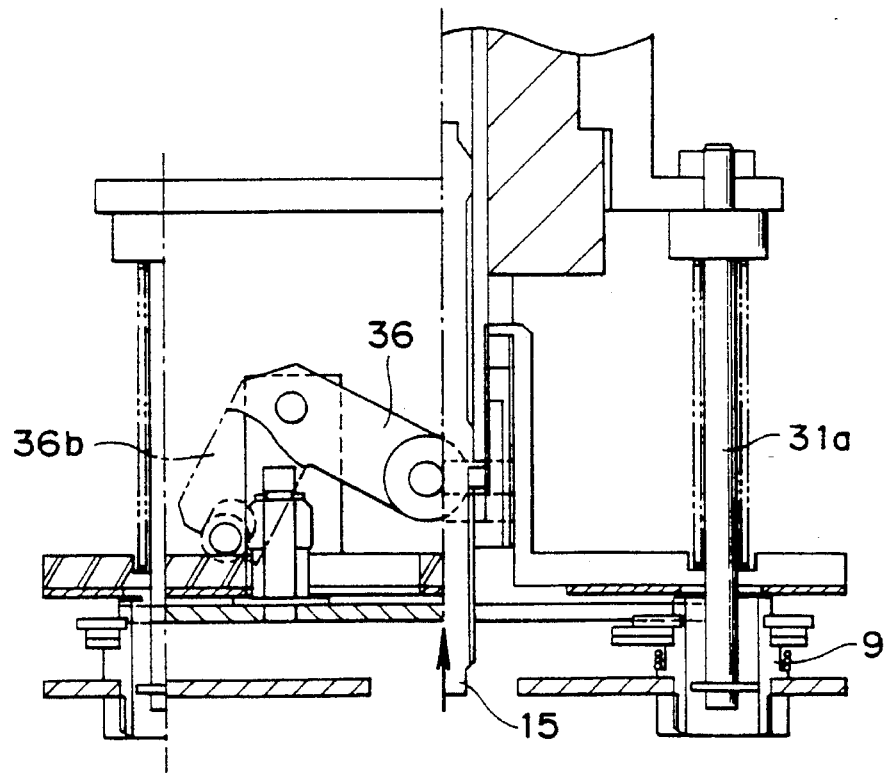
Figure 25:
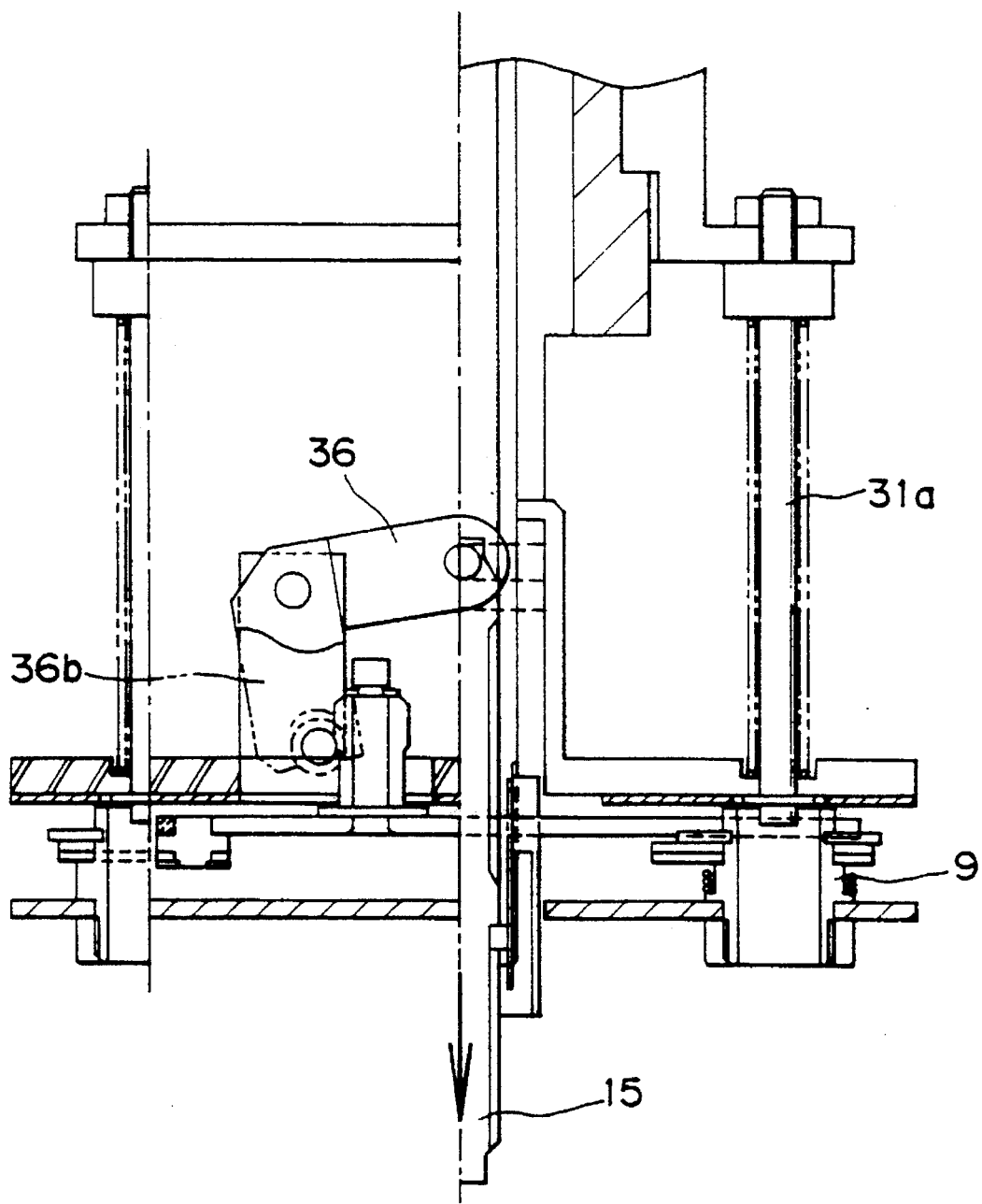
Figure 26:
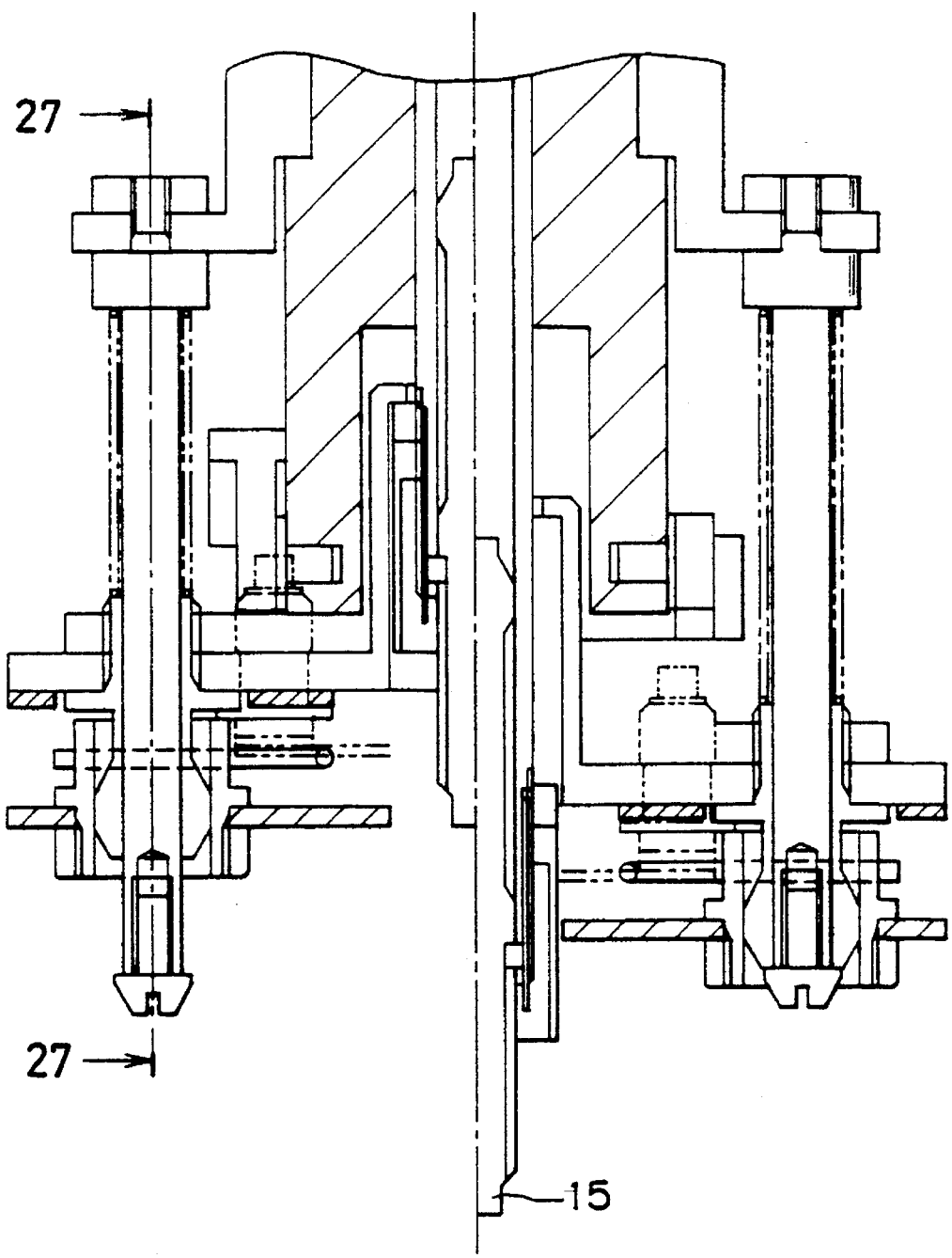
FIG. 26 is a sectional view taken along the line S—S in FIG. 20.
Figure 27:
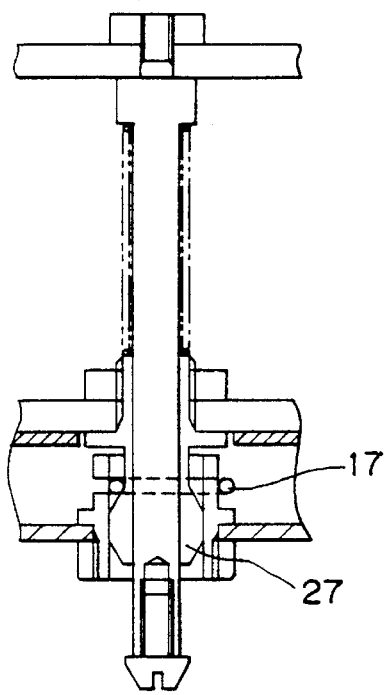
FIG. 27 is a sectional view taken along the line T—T in FIG. 26.
Figure 28:
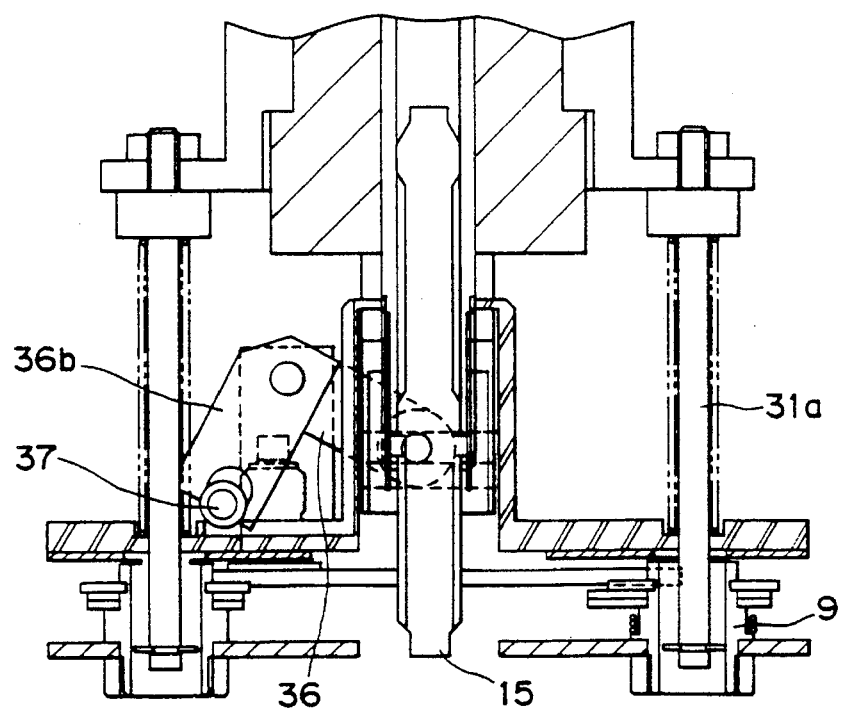
FIG. 28 is a sectional view taken along the line U—U in FIG. 20.

The clamp spring 17 has a shape shown in FIG. 7A in the free state, and in the spread state shown in FIG. 7B, the clamp spring 17 is spread outwardly to be mounted on the clamp block 6 and there is generated a biasing power which tends to bias the clamp spring 17 to a closing directions as shown in arrows in FIG. 7B.

When the clamp pin 27 is inserted Into a through hole of the clamp block 6 as shown by an arrow X in FIG. 6A, a lower taper portion 27a of the clamp pin 27 once spreads the clamp spring 17 outwardly, and the clamp pin 27 is held or gripped by the clamp spring 17 when it is contacted on an upper taper portion 27b of the clamp pin 27 as shown in FIG. 8B.

In addition, a guide pin 30 is screwed into a lower end of each guide post 31b which penetrates through the clamp pin 27.

Figure 1:
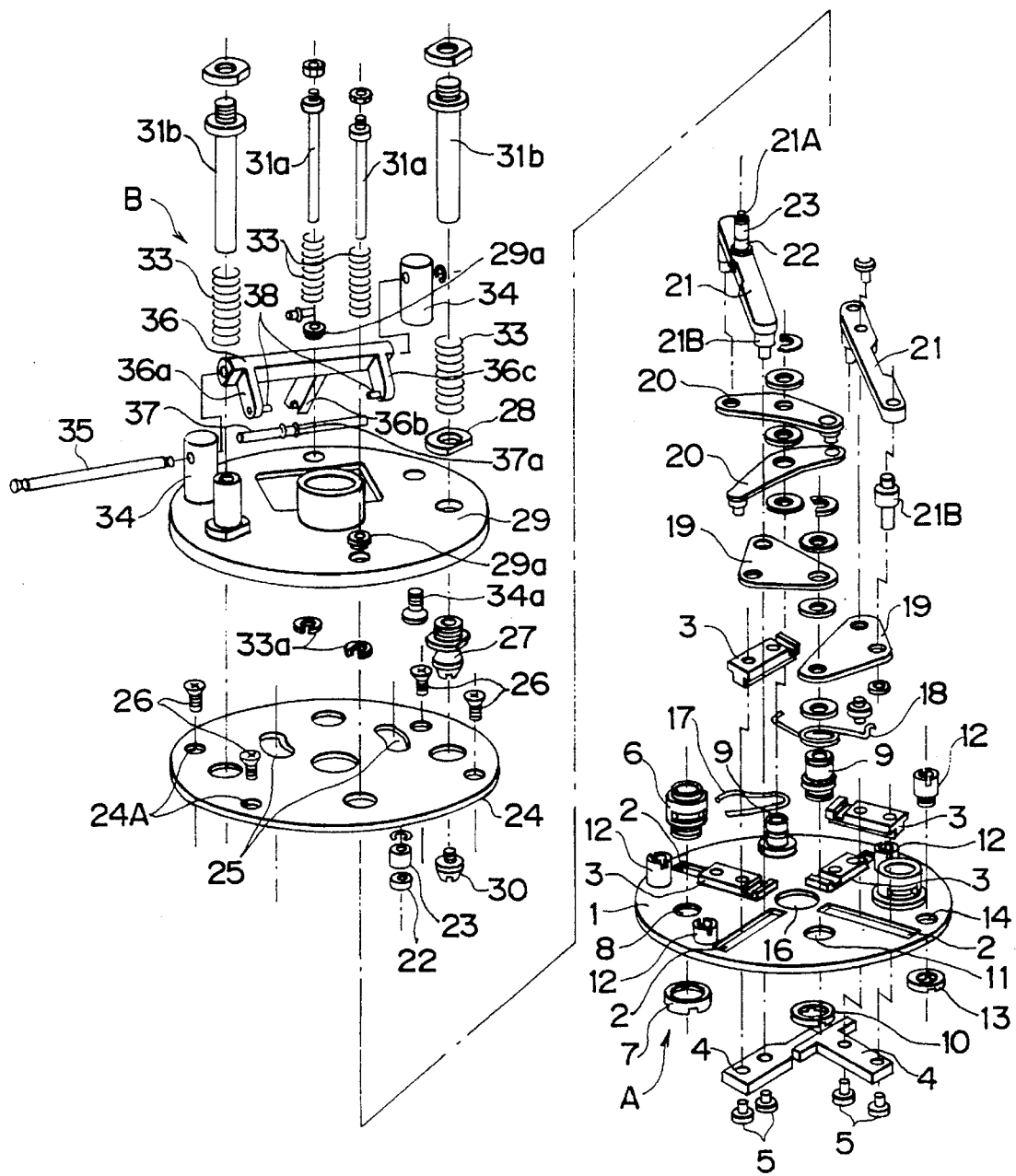
FIG. 1 is a dissembled perspective view showing the component parts of the, work positioner of the chip mounter embodying the present invention.
Figure 2A:
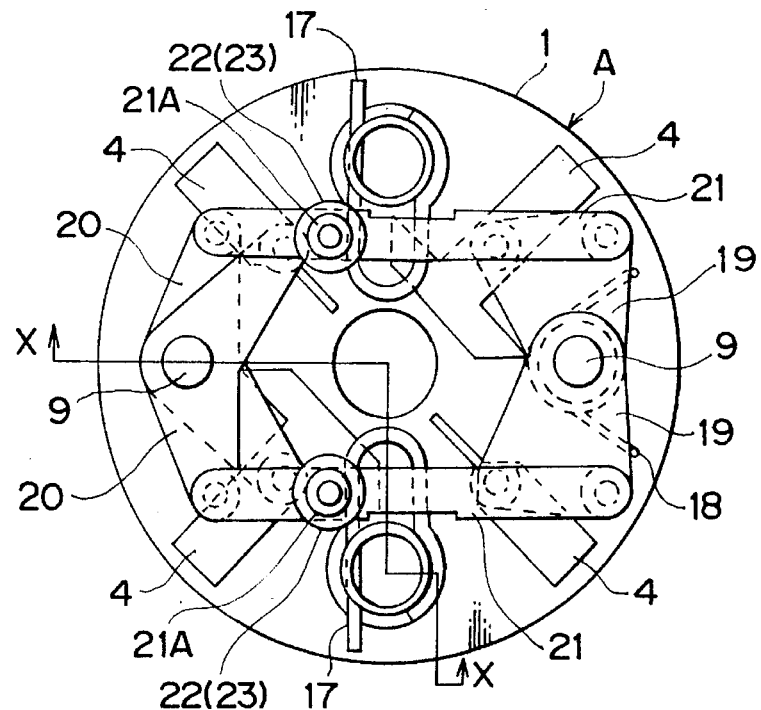
FIGS. 2A and 2B are a schematic plan view of the essential portions of the positioner mechanism section and a schematic, partially sectional view of the work positioner in their open state, respectively.
Figure 2B:
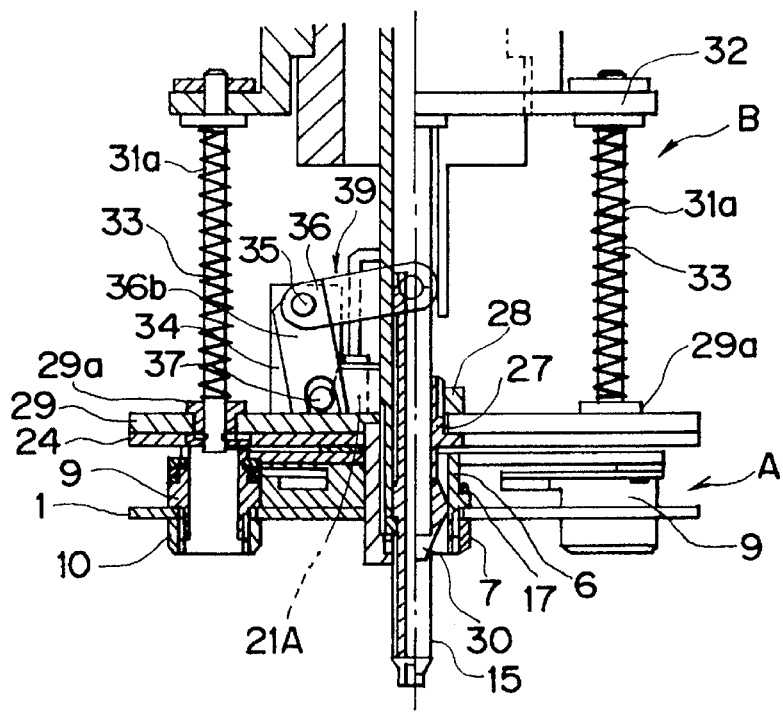

The lower ends of two guide posts 31a serving as support posts are inserted through bushes 29a mounted in holes of the guide plate 29 of the positioner cooperating section B as shown in FIG. 2B, and E rings 33a are snapped on the lower ends of the guide posts 31a, and the upper ends; of the guide posts 31a, 31b are threadably coupled and fixed into a mounting frame 32.

Compression springs 33, 33 are wound around the outer peripheries of the guide posts 31a, 31b, respectively, so as to bias the guide plate 29 downward and away from the mounting frame 32.

The vacuum sucker head 15 is connected with a spindle S of a chip mounter (not shown) via a ring nut 29b threadably mounted on the spindle S of the chip mounter.

Accordingly, as the spindle S of the chip mounter and the vacuum sucker head 15 are moved downward by means of a driving means, not shown, the mounting plate 32 and the guide posts 31a are moved downward, and the guide plate 29 is biased downward by means of the compression springs 33, whereas, as the vacuum sucker head 15 is moved upward, the guide plate 29 is pulled upward against the biasing force of the compression springs 33 because the guide plate 29 is moved upward with the vacuum suction head 15 by means of the engagement between the ring nut 29b and an engaging portion 29c of a tubler portion of the guide plate 29.

Inserted through a pair of support pins 34 provided on the upper surface of the guide plate 29 is a pin 35 which, in turn, is inserted through a slide block 36 between the support pins 34 so as to support the slide block 36.

The pin 35 is inserted into the slide block 36, and both ends of the pin 35 are inserted and supported by two support pins 34a screwed into the guide plate 29. Also, the both ends of the pin 35 has E-rings (not shown) provided for limiting axial movement of the pin 35. Therefore, the slide block 36 can rock about the axis of the pin 35. Support ridges 36a, 36b and 36c project towards radial directions from the side surfaces of the slide block 36 so that the support ridges 36a and 36c project towards same direction and the support ridges 36b projects towards another direction which is offset by 90 digress relative to the direction of the support ridges 36a and 36c. As for these support ridges, a bifurcated portion at the free end of the support ridge 36b located between the support ridges 36a and 36c engages a portion of a roller pin 37 between two flanges 37a. The roller pin 37 is positioned horizontally on the guide plate 29 so that the roller pin 37 can horizontally slide on the guide plate 29 when the slide block 36 rocks about the axis of the pin 35, because the roller pin 37 is held in a space formed between the bifurcated portion at the free end of the support ridge 36b and the appear surface of the guide plate 29 so as not to be escaped from the space.

Figure 3A:
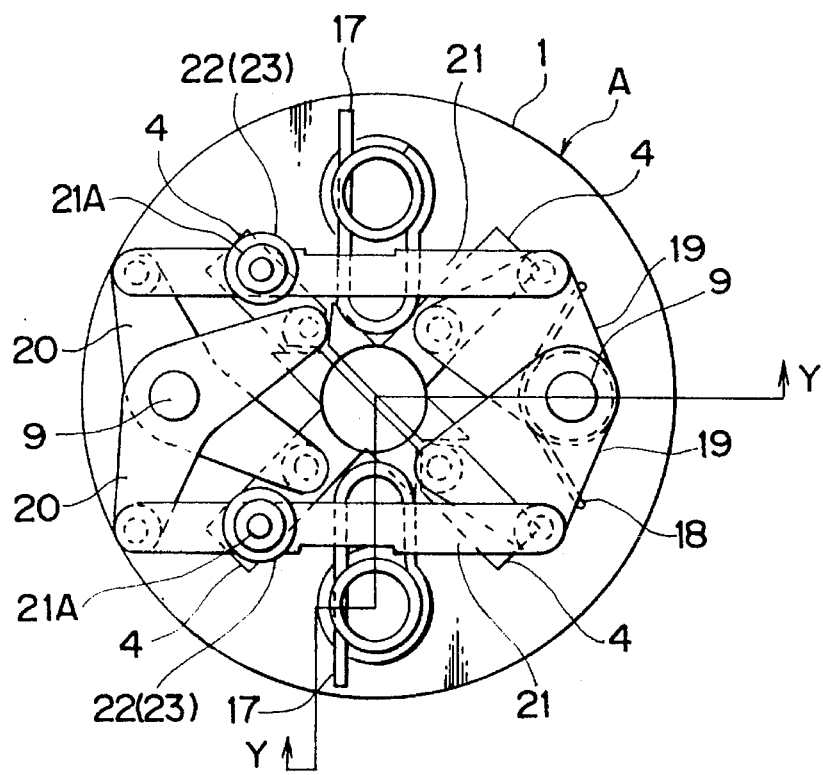
FIGS. 3A and 3B are a schematic plan views of the essential portions of the positioner mechanism section and a schematic, partially sectional view of the work positioner in the closed state of the positioner tips, respectively; and, FIGS. 3C and 3D correspond to FIGS. 3A and 3B, and show an operational state wherein the positioner tips are closed, only one pair of the positioner tips being shown for purposes of clarity.
Figure 3B:
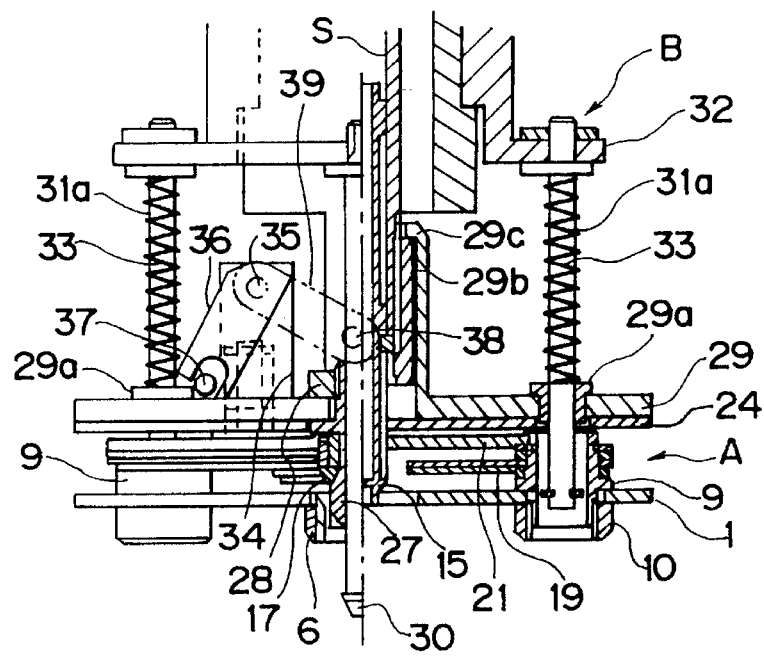
Figure 3C:
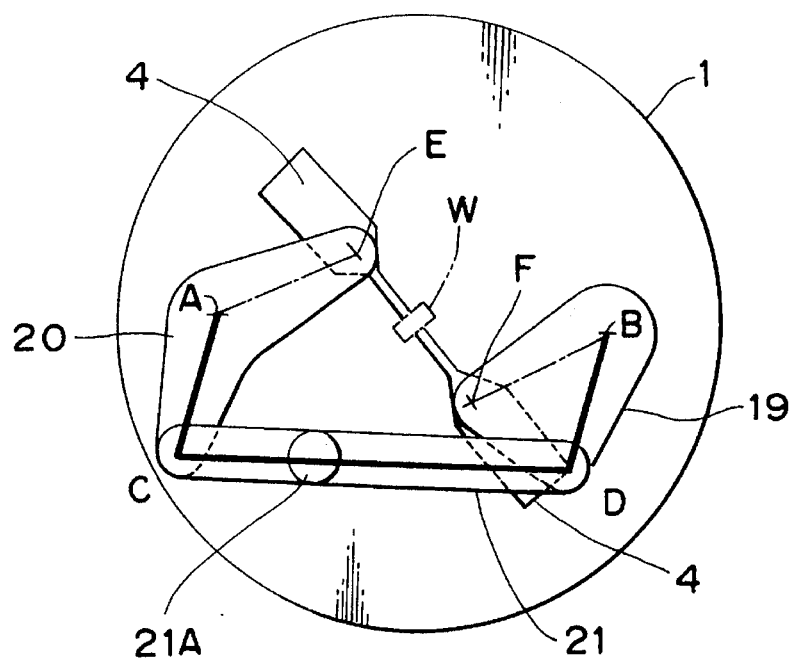
Figure 3D:
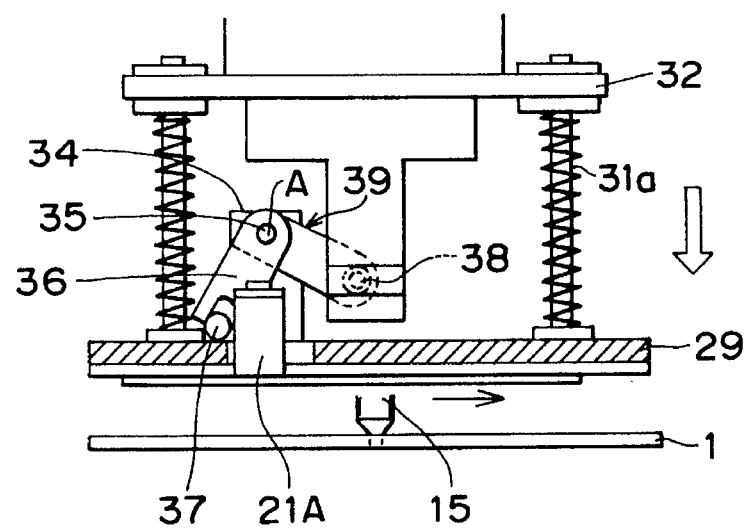
Figure 4:
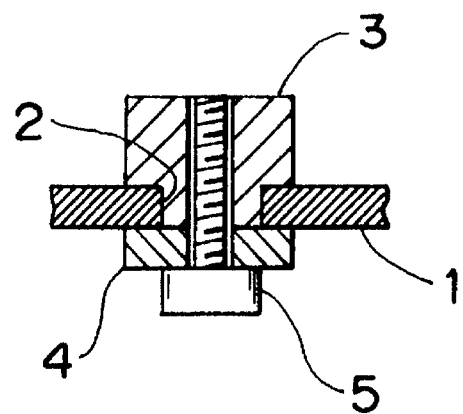
FIG. 4 is a partial sectional view of a positioner chip portion

The roller pin 37 is arranged such that, during this sliding operation, the roller pin 37 pushingly moves the rollers 22, 23 projecting upward from the slide bar 21 of the positioner mechanism section A, through the slots 25 of the guide plate 24 and holes of the guide plate 29 because both ends of the roller pin 37 are located near to or contacted with two rollers 21A as shown in FIG. 3D.

The motion of the slide bar 21, is transmitted from the slide block 36 to the levers 19 and 20 via roller pin 37, pin 21A (and roller 23), slide bar 21, and pin 21B as described later in an operation of the embodiment with reference to FIGS. 2A—2D and 3A—3D.

Thus when the vacuum sucker head 15 is lowered along with the guide plate 29, the roller pin 37 forcedly causes the two pairs of levers 19, 20 to open through the slide bars 21 as also described later in an operation of the embodiment with reference to FIGS. 2A— 2D and 3A—3D.

As shown in FIGS. 2A and 2B, the roller pin 37 pushingly moves The roller 22, 23 and the slide bars 21 are moved to the position shown in FIG. 2A, the two pairs of levers 19, 20 are forcedly caused to open as described later in an operation of the embodiment. As described above, these two pairs of levers 19 and 19, 20 and 20 are rockingly connected to each other respectively, and respective levers 19 and 20 are interlockingly connected to each other by means of a pair of slide bars 21 whereas the vacuum sucker head 15 rises, the biasing spring 18 which is engaged with the levers 19 and 20 at portions protruded from the underside thereof biases the levers 19, 20 in the centripetal direction, i.e. in the closed direction as shown in arrows in FIG. 2C.

In other words, as the biasing spring 18 always biases the lever 19 in the state of FIG. 2A to energize the slide bars 21 towards left in FIG. 2A, the biasing spring 18 is biased when the slide bars 21 are moved by a force applied from outside. As the ring nut 29b screwed over the spindle S of the chip mounter abuts a portion of the guide plate 29 to lift up the guide plate 29, and the mounting plate 32 and the guide plate 29 are moved relatively with each other, the slide block 36 rocks and the roller pin 37 engaged with the slide block 36 pushes the slide bars 21. The vacuum sucker head 15 is inserted into the spindle S of the chip mounter.

Figure 2C:
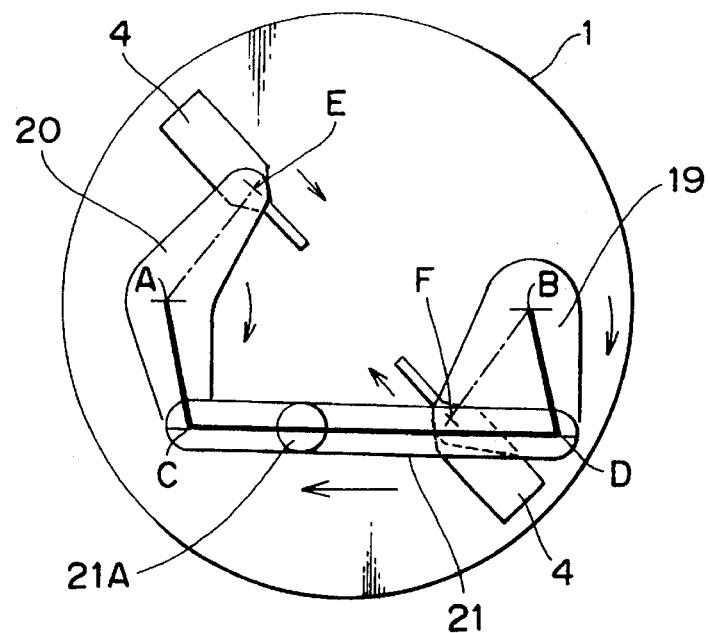
FIGS. 2C and 2D correspond to FIGS. 2A and 2B, and show an operational state wherein the positioner tips are opened, only one pair of the positioner tips being shown for purposes of clarity.

This biasing force in the centripetal direction of the biasing spring 18 is a force which biases the lever 19 to the closed direction to close the positioner chips 4, the lever 20, and the slide bars 21 with the lever 19 as shown In FIGS. 2A and 2C, 3A and 3C and described hereinafter in an operation of the embodiment. Whereby, the levers 19, 20 and slide bars 21 are moved from the position shown in FIG. 2A to the position shown in FIG. 3A to close the positioner chips 4 by equal amounts as described later in an operation of the embodiment. This equalized movement of the positioner tip 4 is realized by the interconnected relationship between the positioner tips 4, the levers 19, 20 and the slide bars 21 as shown in FIGS. 2A and 3A.

Incidentally, reference numeral 38 (Refer to FIGS. 2B and 3B) denotes a guide pin, that moves upwardly and downwardly coaxially to the vacuum sucker head 15. A link 39 (FIGS. 2B, 2D and 3B, 3D) is fixed to the guide block 36 and to the guide pin 38.

OPERATION OF THE EMBODIMENT

Operation of this embodiment will hereunder be described with reference to FIGS. 2A—D and 3A—D.

FIGS. 2A and 2B show a state where the vacuum sucker head 15 is lowered, whereby The positioner tips 4 are in the open state, and FIGS. 3A and 3B illustrate a state where the vacuum sucker head 15 is raised, whereby the positioner tips 4 are in the closed state. The upward or downward movement of the vacuum sucker head 15 and the close or open movement of the positioner tips 4, and the relationship of These movements are described hereinunder.

More specifically, when the work W such as the chip-shaped electronic part is supplied by a parts feeder mechanism of the chip mounter, such as disclosed in U.S. Pat. Nos. 4,753,004, 4,768,915, and 4,952,113, to a predetermined position, the vacuum sucker head 15 is lowered by a driving means, not shown.

At this time, the guide plate 29 is biased downward by the compression springs 33, 33. Along with this, the slide block 36 is turned about the pin 35, whereby the roller pin 37 slides horizontally on the upper surface of the guide plate 29.

As the roller pin slides, the rollers 22, 23 projecting upward from the slide bars 21 of the positioner mechanism section A are pushed and moved by the roller pin 37. With this operation, when the vacuum sucker head 15 is lowered, the two pairs of levers 19, 20 are opened by means of the slide bars 21, whereby the positioner blocks 3 linearly move outward along the guide grooves 2, so that the positioner tips 4 are forced to open in directions of being separated from each other by the operation of the positioner cooperating section B (Refer to FIGS. 2A and 2B).

Positions of the positioner tips 4, 4 are changed according to upward or downward movement of the vacuum sucker head 15.

In other words, the positioner tips 4, 4 are closed as the vacuum sucker head 15 is moved upward, and the positioner tips 4, 4 are opened as the vacuum sucker head 15 is moved downward.

Also, the vacuum sucker head 15 can move downward further from a height where the positioner tips 4, 4 are fully opened to the lowest end of the movement thereof, and when the vacuum sucker head 15 moves upward, the positioner tips 4, 4 are fully opened until said height of the head 15 and begins to be opened as the head 15 moves upward from the height.

Figure 2D:
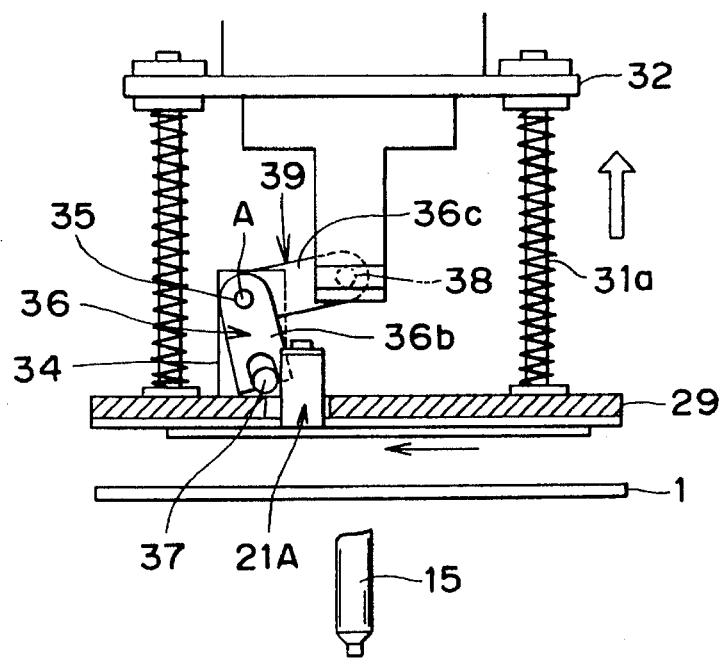

When the positioner tips 4, 4 are opened as shown in FIGS. 2C and 2D, the lever 20, slide bar 21, and lever 19 form a parallel link ACDB as to fulcrums A and B. By this parallel link ACDB, each of the levers 20 and 19 are pivoted at each of the fulcrums A and B synchronously by the same degree. As the distances between fulcrum A and point E of action, and between fulcrum B and point F of action are the same, the positioner tips 4, 4 are moved synchronously the same distance.

In the state of the positioner tips 4, as shown in FIGS. 3C and 3D, as the bit 15 is moved downward, the lever 20 is pivoted at the fulcrum A and the pin 21A is moved by the slide bar 21 to open the positioner tips 4, 4.

Then, the lower end face of the vacuum sucker head 15 vacuum-sucks the work such as the chip-shaped electronic part shown as W in FIG. 2B by a vacuum applied through a vacuum passage 15A opened through the vacuum sucker head 15 from the lower end to the upper end thereof. A vacuum source such as a vacuum pump (not shown) is connected to the upper end of the vacuum sucker head 15.

Thereafter, as the vacuum sucker head 15 is raised the levers 19, 20 are biased towards closed direction by means of the biasing force in the centripetal direction of the positioner mechanism section A, whereby the positioner blocks 3 close along the guide grooves 2, whereby the two pairs of positioning tips 4 close towards the center while being equalized by equal values, respectively, so that the work sucked at the forward end. i.e. the lower end of the vacuum sucker head 15 can be accurately positioned at the center of the vacuum sucker head 15. Thus, as the bit 15 is moved upward, the slide bar 21 is moved outward to close the positioner tips 4, 4 by means of biasing force of the spring 17.

Further, when the work is to be mounted on an IC substrate or the like for example, as the vacuum sucker head 15 is lowered, the positioner tips 4 are forced to open by the operation of the positioner driving section B as described above, whereby the work is accurately positioned at the predetermined center position by the forward end of the vacuum sucker head 15 as aforesaid, so that the work can be mounted at the predetermined position on the substrate with high accuracy.

In addition, in this embodiment, when it is desired to remove the positioner mechanism section A from the positioner cooperating section B for the purposes of exchange, repair, maintenance or the like, the removal or mounting of the positioner mechanism section A can be easily effected at a single operation only by removing the clamp spring 17 engaged with the clamp pin 27 therefrom.

Incidentally, the present invention need not necessarily be limited to the above embodiment, and it is possible to adopt various modifications which are included in the present invention.

The work positioner of the chip mounter according to the present invention comprises the positioner mechanism section for positioning the chip-shaped work and the positioner cooperating section for cooperating with the positioner mechanism section, and the positioner mechanism section includes the guide plates, the positioner blocks reciprocatively moving along at least one pair of guide grooves formed in a straight line and opposed to each other on the guide plates, and at least one pair of positioner tips connected to the respective positioner blocks while clamping the guide plate in cooperation with the positioner blocks and adapted to open or close in operational association with the reciprocatory motions of the positioner blocks so as to clamp the chip-shaped work therebetween and to release it, whereby the positioner blocks and the positioner tips smoothly move along the guide grooves of the guide plate, so that the work can be positioned with high accuracy.

What is claimed is:

1. A work positioner for positioning a chip-shaped electronic part comprising:
    a guide plate having at least one pair of elongated guide grooves, elongated along a straight line and opposed to each other on said plate;
    a positioner block for each said guide groove reciprocally and slidably movable along said guide grooves;
    at least one pair of positioner tips connected to respective said positioner blocks such that said guide plate is sandwiched between said positioner tips and said positioner block; and
    means for moving said positioner blocks reciprocally and slidably along said guide grooves to cause corresponding movement of said positioner tips such that said positioner tips open or close in operational association with the reciprocal slidable movement of said positioner blocks in said guide grooves so as to enable said positioner tips to clamp said chip-shaped electronic part therebetween or to release it;
    a first pair of levers, commonly pivotable about a first pivot and a second pair of levers commonly pivotable about a second pivot, one lever of said first pair of levers being connected to one of said positioner tips via one connecting means, and one lever of said second pair of levers being connected to the other of said positioner tips, via another connecting means;
    a pair of spaced and parallel slide bars movable to open or close said positioner tips, one lever of said first pair of levers and one lever of said second pair of levers being connected to one of said slide bars, the other lever of said first pair of levers and the other lever of said second pair of levers being connected to the other said slide bar such that said slide bars are movable in directions parallel to each other, each said pair of levers and each said slide bar form a parallel link as to fulcrums at said first and second pivots, and the distances between one fulcrum and one point of action of one of said levers and between another fulcrum and another point of action of another one of said levers are the same so as to move said positioner tips synchronously by equal amounts such that movement of said slide bars in a first predetermined direction causes said first and second pairs of levers to correspondingly pivot about said respective common pivots,
    a spring for biasing said lever pairs apart such that movement of said slide bars in said first predetermined direction causes said positioner tips to be moved by equal amounts toward a predetermined center position;
    a plurality of guide posts having lower ends;
    a second guide plate provided at the lower ends of said guide posts for reciprocal movement along said guide posts,
    biasing means on said guide posts to bias said second guide plate in a first direction;
    a slide block mounted onto said second guide plate by a pin for pivotal movement about the pin with respect to said second guide plate, and
    a roller pin engageable with said slide block and said guide plate for sliding movement along said second guide plate during pivotal movement of said slide block with respect to said second guide plate.

2. A work positioner as set forth in claim 1, wherein two pairs of said positioner tips are provided.

3. A work positioner as set forth in claim 1 including means for engaging said roller pin with one of said slide bars such that movement of said roller pin causes movement of said slide bars and corresponding movement of said positioner tips.

* * * * *

UNITED STATES PATENT AND TRADEMARK OFFICE
CERTIFICATE OF CORRECTION

PATENT NO. : 5,497,983                                      Page 1 of 3
DATED      : March 12, 1996
INVENTOR(S): Teruhiko Fujioka It is certified that error appears in the above-identified patent and that said Letters Patent is hereby corrected as shown below:

Title page:

| | |
|---|---|
| Item [54]: | change "MONITORING" to --MOUNTING-- |
| Column 1, line 2 | change "MONITORING" to --MOUNTING-- |
| Column 1, line 23 | delete colon after "vacuum sucking" |
| Column 1, line 49 | change "aced" to --need-- |
| Column 2, line 10 | delete comma after "the" (first occurrence) |
| Column 2, line 30 | insert semi-colon after "portion" |
| Column 2, line 47 | change "in the direction N in" to --along the line 11-11 of-- |
| Column 2, line 48 | change "0-0" to --12-12-- |
| Column 2, line 50 | change "P" to --13-- |
| Column 2, lines 51-52 | change "H-H, I-I, J-J, K-K, and L-L" to --14-14, 15-15, 16-16, 17-17, and 18-18--; |

UNITED STATES PATENT AND TRADEMARK OFFICE
CERTIFICATE OF CORRECTION

PATENT NO. : 5,497,983
DATED : March 12, 1996
INVENTOR(S) : Teruhiko Fujioka

It is certified that error appears in the above-identified patent and that said Letters Patent is hereby corrected as shown below:

| | |
|---|---|
| Column 2, line 53 | change "M-M" to --19-19-- |
| Column 2, line 55 | change "R-R" to --20-20-- |
| Column 2, line 58 | change "line Q-Q" to --lines 21-21 and 22-22-- |
| Column 2, line 61 | change "line P-P" to --lines 23-23, 24-24 and 25-25-- |
| Column 2, line 64 | change "S-S" to --26-26-- |
| Column 3, line 1 | change "T-T" to --27-27-- |
| Column 3, line 3 | change "U-U" to --28-28-- |
| Column 3, line 13 | change "position" to --positioner-- |
| Column 3, line 46 | change "or" to --of-- |
| Column 3, line 65 | change "20.20" to --20,20-- |
| Column 4, | change "8B" to --6B-- |

UNITED STATES PATENT AND TRADEMARK OFFICE
CERTIFICATE OF CORRECTION

PATENT NO. : 5,497,983
DATED : March 12, 1996
INVENTOR(S) : Teruhiko Fujioka

It is certified that error appears in the above-indentified patent and that said Letters Patent is hereby corrected as shown below:

| | |
|---|---|
| Column 4, line 35 | change "8B" to --6B-- |
| Column 4, line 43 | delete semi-colon after "ends" |
| Column 6, line 3 | change "tip" to --chip-- |
| Column 6, line 5 | change "ips" to --chips-- |
| Column 6, line 34 | insert "37" after "pin" |
| Column 7, line 17 | change "end." to --end,-- |

Signed and Sealed this

Tenth Day of September, 1996

Attest:

BRUCE LEHMAN

*Attesting Officer*  *Commissioner of Patents and Trademarks*